United States Patent

Kanna et al.

(10) Patent No.: US 11,567,410 B2
(45) Date of Patent: Jan. 31, 2023

(54) PATTERN FORMATION METHOD, LAMINATE, AND METHOD OF PRODUCING TOUCH PANEL

(71) Applicant: FUJIFILM Corporation, Tokyo (JP)

(72) Inventors: Shinichi Kanna, Shizuoka (JP); Takashi Aridomi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 495 days.

(21) Appl. No.: 16/752,080

(22) Filed: Jan. 24, 2020

(65) Prior Publication Data

US 2020/0159123 A1 May 21, 2020

Related U.S. Application Data

(63) Continuation of application No. PCT/JP2018/027763, filed on Jul. 24, 2018.

(30) Foreign Application Priority Data

Jul. 28, 2017 (JP) .............................. JP2017-147152

(51) Int. Cl.
 *H05K 3/00* (2006.01)
 *G03F 7/26* (2006.01)
 (Continued)

(52) U.S. Cl.
 CPC .................. *G03F 7/26* (2013.01); *G03F 7/09* (2013.01); *G06F 3/041* (2013.01); *H05K 3/0023* (2013.01);
 (Continued)

(58) Field of Classification Search
 CPC . G03F 1/80; G03F 7/0047; H05K 2201/0108; H05K 3/064; H05K 2203/0554; H05K 3/0023; Y10T 29/49155
 (Continued)

(56) References Cited

U.S. PATENT DOCUMENTS 5,334,487 A 8/1994 Kindl et al.
8,920,666 B2 * 12/2014 Igarashi .................... G03F 1/62
 216/76
(Continued)

FOREIGN PATENT DOCUMENTS

JP 2011-154080 A 8/2011
JP 2011-197754 A 10/2011
(Continued)

OTHER PUBLICATIONS

Communication dated Oct. 6, 2020 from Japanese Patent Office in JP Application No. 2019-532648.
(Continued)

*Primary Examiner* — Thiem D Phan
(74) *Attorney, Agent, or Firm* — Sughrue Mion, PLLC

(57) ABSTRACT

Provided are a pattern formation method including a step of preparing a base material which has an etching layer transparent to an exposure wavelength on each of two surfaces thereof and is transparent to the exposure wavelength, a step of forming a photosensitive resin layer, in which an optical density to the exposure wavelength is in a range of 0.50 to 2.50, on the etching layer on each of the two surfaces of the base material, a step of pattern-exposing the photosensitive resin layer, a step of developing the photosensitive resin layer to form a resist pattern on two surfaces, a step of removing the etching layer on a portion that is not coated with the resist pattern, and a step of peeling the resist pattern off, in this order, a laminate, and a method of producing a touch panel.

15 Claims, 1 Drawing Sheet

(51) Int. Cl.
*G03F 7/09* (2006.01)
*G06F 3/041* (2006.01)
*H05K 3/06* (2006.01)

(52) U.S. Cl.
CPC ... *H05K 3/064* (2013.01); *G06F 2203/04103* (2013.01); *Y10T 29/49155* (2015.01)

(58) Field of Classification Search
USPC .............. 29/846, 428, 840, 603.18, DIG. 16
See application file for complete search history.

(56) References Cited

U.S. PATENT DOCUMENTS

| | | | |
|---|---|---|---|
| 10,126,585 B2 * | 11/2018 | Kimura | G06F 3/0412 |
| 2011/0289771 A1 | 12/2011 | Kuriki | |
| 2013/0161070 A1 | 6/2013 | Lee et al. | |
| 2013/0175154 A1 | 7/2013 | Takahashi | |
| 2013/0277100 A1 | 10/2013 | Ra et al. | |
| 2017/0253719 A1 | 9/2017 | Morozumi et al. | |
| 2018/0018041 A1 | 1/2018 | Omote et al. | |

FOREIGN PATENT DOCUMENTS

| | | |
|---|---|---|
| JP | 2012-006377 A | 1/2012 |
| JP | 2012-138028 A | 7/2012 |
| JP | 2013-131200 A | 7/2013 |
| JP | 2016-224735 A | 12/2016 |
| JP | 2017-059296 A | 3/2017 |
| TW | 201229624 A1 | 7/2012 |
| WO | 2016/088609 A1 | 6/2016 |
| WO | 2016/199868 A1 | 12/2016 |

OTHER PUBLICATIONS

Communication dated Jul. 21, 2020, from the Japanese Patent Office in application No. 2019-532648.
International Search Report dated Oct. 9, 2018, issued by the International Searching Authority in application No. PCT/JP2018/027763.
Written Opinion dated Oct. 9, 2018, issued by the International Searching Authority in application No. PCT/JP2018/027763.
International Preliminary Report on Patentability dated Jan. 28, 2020, issued by the International Bureau in application No. PCT/JP2018/027763.
Office Action dated Apr. 5, 2022 issued by the Japanese Patent Office in Japanese Application No. 2021-069067.
Office Action dated Mar. 31, 2022 issued by the Taiwanese Patent Office in Taiwanese Application No. 107126094.

* cited by examiner

PATTERN FORMATION METHOD, LAMINATE, AND METHOD OF PRODUCING TOUCH PANEL

CROSS-REFERENCE TO RELATED APPLICATIONS

This application is a continuation application of International Application No. PCT/JP2018/027763, filed Jul. 24, 2018, the disclosure of which is incorporated herein by reference in its entirety. Further, this application claims priority from Japanese Patent Application No. 2017-147152, filed Jul. 28, 2017, the disclosure of which is incorporated herein by reference in its entirety.

BACKGROUND OF THE INVENTION

1. Field of the Invention

The present disclosure relates to a pattern formation method, a laminate, and a method of producing a touch panel.

2. Description of the Related Art

In the related art, a pattern formation method of patterning an etching layer on a base material according to a photo-etching method has been known.

Here, in recent years, etching layers formed on two surfaces of a base material are respectively patterned as independent patterns in some cases.

For example, in the field of touch panels, there is a case where processing such as patterning of a position detection electrode in an X-axis direction on one surface of a base material and patterning of a position detection electrode in a Y-axis direction on the other surface of the base material is performed for the purpose of producing a wiring for a touch sensor.

As the method of forming patterns with different shapes on two surfaces of a base material, the methods described in JP2016-224735A, JP2011-197754A, and JP2011-154080A have been known.

JP2016-224735A describes "a method of forming a touch sensor, comprising: a step of forming a light-shielding metal layer on each of two surfaces of a base film having UV cutting performance and forming a first photosensitive resin layer on each light-shielding metal layer; an exposure step of irradiating the first photosensitive resin layer on the light-shielding metal layer with UV light through different pattern masks on two surfaces thereof; a step of developing the exposed first photosensitive resin layer to form a resist pattern; an etching step of removing the light-shielding metal layer on a portion that is not coated with the resist pattern to form a lay-out circuit pattern; a step of peeling and removing the first photosensitive resin layer that covers the lay-out circuit pattern from at least a connection part; a step of laminating a photosensitive conductive film comprising a support film, a conductive layer which is provided on the support film and contains conductive fibers, and a second photosensitive resin layer provided on the conductive layer, on each of two surfaces of the base film where the lay-out circuit patterns are formed such that the second photosensitive resin layer adheres each of two surfaces; an exposure step of irradiating the second photosensitive resin layer on the photosensitive conductive film laminated on each of two surfaces of the base film with UV light through different pattern masks on two surfaces; and a development step of developing the exposed second photosensitive resin layer to also remove the conductive layer laminated on a portion from which the second photosensitive resin layer is removed so that an electrode pattern electrically connected to the lay-out circuit pattern is formed".

JP2011-197754A describes "a method of producing a touch panel sensor comprising: a step of preparing a laminate which includes a transparent base film, a first transparent conductive layer provided on one surface of the base film, a second transparent conductive layer provided on the other surface of the base film, and a conductive coating layer that is provided on the first transparent conductive layer and has light-shielding properties and conductivity; a step of forming a first photosensitive layer having a predetermined pattern on the conductive coating layer by performing an exposure treatment and a development treatment thereon and forming a second photosensitive layer having a pattern different from the pattern of the first photosensitive layer on the second transparent conductive layer by performing an exposure treatment and a development treatment thereon; a step of etching the conductive coating layer using the first photosensitive layer as a mask so as to pattern the conductive coating layer; a step of etching the first transparent conductive layer using the first photosensitive layer and the conductive coating layer as masks and etching the second transparent conductive layer using the second photosensitive layer as a mask so as to pattern the first transparent conductive layer and the second transparent conductive layer; a step of forming a third photosensitive layer to be disposed only on a part of the conductive coating layer by performing an exposure treatment and a development treatment; a step of etching the conductive coating layer using the third photosensitive layer as a mask and removing the conductive coating layer other than the part of the conductive coating layer to form a first extraction conductor electrically connected to the first transparent conductive layer that has been patterned through this removal; and a step of forming a second extraction conductor electrically connected to the patterned second transparent conductive layer on the other surface of the base film, in which the second extraction conductor is formed according to a screen printing method".

JP2011-154080A describes "a method of forming a pattern on two surfaces of a transparent base material comprising: in pattern formation of a transparent metal film provided on each of the front and rear surfaces of the transparent base material, forming an opaque layer which shields exposure light on at least one transparent metal film between the transparent metal films and coating each of the front and rear surfaces of the transparent base material with a photoresist to form a photoresist film".

SUMMARY OF THE INVENTION

In the methods of JP2016-224735A and JP2011-197754A, an etching resist formed of a photosensitive resin layer is formed on each of two surfaces of the base material having an etching layer on two surfaces thereof to form a pattern on each of two surfaces.

In the methods of JP2016-224735A and JP2011-197754A, since the etching layer includes a light-shielding metal layer, pattern exposure light from one side of the base material does not reach the photosensitive resin layer on the opposite side, and thus it is considered that an independent pattern can be formed on each of two surfaces.

However, in the field of touch panel display devices and the like, from the viewpoint of the image quality and the like of the display image, it is required to form a pattern of a transparent etching layer to be disposed on two surfaces in some cases.

The present inventors found that it is difficult to form a pattern on one surface which is independent from a pattern on the other surface in a case where the patterns are formed using a transparent base material and a transparent etching layer according to the method described in JP2016-224735A or JP2011-197754A because exposure light applied to one surface in order to form an etching resist on one surface also exposes a photosensitive resin layer on the other surface.

In the present disclosure, a phenomenon in which exposure light applied to one surface also exposes a photosensitive resin layer on the other surface is referred to as occurrence of exposure fogging on the other surface.

In a case where the exposure fogging is suppressed, the photosensitive resin layers on one surface and the other surface can be respectively exposed by different exposure patterns. Therefore, it is possible to form different independent resist patterns on one surface and the other surface. As a result, it is possible to form different independent patterns of etching layers on one surface and the other surface.

Further, JP2011-154080A describes that a pattern of an etching layer is formed by forming an opaque layer shielding exposure light on at least one surface of the base material and forming an etching resist thereon.

The present inventors found that there is a problem in that the productivity is degraded in a case where the method described in JP2011-154080A is used due to an increase in the number of steps in the pattern formation method because a step of forming an additional opaque layer is required to be performed.

An object according to an embodiment of the present disclosure is to provide a pattern formation method or a method of producing a touch panel, in which an etching resist to be obtained has an excellent pattern shape and the phenomenon of exposure fogging on one surface caused by exposure light applied to the other surface is suppressed.

Further, an object according to another embodiment of the present disclosure is to provide a laminate in which an etching resist to be obtained has an excellent pattern shape and the phenomenon of exposure fogging on one surface caused by exposure light applied to the other surface is suppressed.

Specific means for achieving the objects includes the following aspects.

<1> A pattern formation method comprising: a step of preparing a base material which has an etching layer transparent to an exposure wavelength on each of two surfaces thereof and is transparent to the exposure wavelength; a step of forming a photosensitive resin layer, in which an optical density to the exposure wavelength is in a range of 0.50 to 2.50, on the etching layer on each of the two surfaces of the base material; a step of pattern-exposing the photosensitive resin layer; a step of developing the photosensitive resin layer to form a resist pattern on each of the two surfaces; a step of removing the etching layer on a portion that is not coated with the resist pattern; and a step of peeling the resist pattern off, in this order.

<2> The pattern formation method according to <1>, in which an exposure amount in the step of exposure is in a range of $10^{(n-0.5)}$ mJ/cm$^2$ to $10^{(n+1.5)}$ mJ/cm$^2$, and n represents the optical density of the photosensitive resin layer to the exposure wavelength.

<3> The pattern formation method according to <1>, in which the exposure amount in the step of exposure is in a range of $10^n$ mJ/cm$^2$ to $10^{(n+1.0)}$ mJ/cm$^2$.

n represents an optical density of the photosensitive resin layer to the exposure wavelength.

<4> The pattern formation method according to any one of <1> to <3>, in which a film thickness of the photosensitive resin layer is 8.0 µm or less. <5> The pattern formation method according to any one of <1> to <4>, in which exposure light in the step of exposure has a maximum wavelength at a wavelength of 365 nm.

<6> The pattern formation method according to any one of <1> to <5>, in which the step of forming the photosensitive resin layer is a step of laminating a transfer film, which includes a temporary support and a photosensitive resin layer with an optical density of 0.50 to 2.50 on the temporary support, on the etching layer.

<7> The pattern formation method according to <6>, in which an optical density of the entire transfer film having been laminated in the step of laminating the transfer film is in a range of 0.50 to 2.50.

<8> The pattern formation method according to any one of <1> to <7>, in which the optical density of the formed photosensitive resin layer in the step of forming the photosensitive resin layer is in a range of 1.00 to 2.00.

<9> The pattern formation method according to any one of <1> to <8>, in which the photosensitive resin layers on the two surfaces of the base material are simultaneously exposed in the step of exposure.

<10> The pattern formation method according to any one of <1> to <9>, in which the etching layer is a conductive layer.

<11> The pattern formation method according to any one of <1> to <10>, in which the photosensitive resin layer contains a polymerizable compound and a polymerization initiator.

<12> The pattern formation method according to any one of <1> to <11>, in which the photosensitive resin layer contains an ultraviolet absorbing material.

<13> The pattern formation method according to <12>, in which the ultraviolet absorbing material contains carbon black.

<14> A laminate comprising: a base material which is transparent to an exposure wavelength; two etching layers which are respectively disposed on two surfaces of the base material and are transparent to the exposure wavelength; and two photosensitive resin layers which are respectively disposed on the two etching layers and in which an optical density to the exposure wavelength is in a range of 0.50 to 2.50.

<15> A method of producing a touch panel, comprising: the pattern formation method according to any one of <1> to <13>.

According to an embodiment of the present disclosure, it is possible to provide a pattern formation method or a method of producing a touch panel, in which an etching resist to be obtained has an excellent pattern shape and the phenomenon of exposure fogging on one surface caused by exposure light applied to the other surface is suppressed.

Further, according to another embodiment of the present disclosure, it is possible to provide a laminate in which an etching resist to be obtained has an excellent pattern shape and the phenomenon of exposure fogging on one surface caused by exposure light applied to the other surface is suppressed.

DESCRIPTION OF THE PREFERRED EMBODIMENTS

Figure 1:
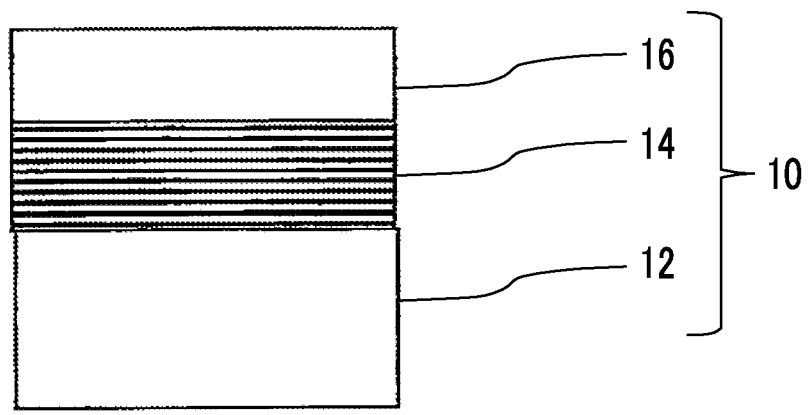
FIG. 1 is a schematic view illustrating an example of a transfer film used in the present disclosure.

In the present disclosure, the numerical ranges shown using "to" indicate ranges including the numerical values described before and after "to" as the lower limits and the upper limits.

In the present disclosure, the amount of each component in a layer such as a photosensitive resin layer indicates the total amount of a plurality of substances present in the layer in a case where there are a plurality of substances corresponding to each component in the layer, unless otherwise specified.

In the present disclosure, the term "steps" include not only independent steps but also steps whose intended purposes are achieved even in a case where the steps cannot be precisely distinguished from other steps.

In the present disclosure, "(meth)acryl" indicates at least one of acryl or methacryl, and "(meth)acrylate" indicates at least one of acrylate or methacrylate.

In the present disclosure, the proportion of a constitutional unit in a polymer indicates the molar ratio unless otherwise specified.

(Pattern Formation Method)

A pattern formation method according to the embodiment of the present disclosure includes a step of preparing a base material which has an etching layer transparent to an exposure wavelength on two surfaces thereof and is transparent to the exposure wavelength; a step of respectively forming a photosensitive resin layer, in which an optical density to the exposure wavelength is in a range of 0.50 to 2.50, on each etching layer on two surfaces of the base material (a step of forming a photosensitive resin layer); a step of pattern-exposing the photosensitive resin layer; a step of developing the photosensitive resin layer to form a resist pattern on two surfaces; a step of removing the etching layer on a portion that is not coated with the resist pattern; and a step of peeling the resist pattern off, in this order.

In the pattern formation method according to the embodiment of the present disclosure, an etching resist to be obtained has an excellent pattern shape and the phenomenon of exposure fogging on one surface caused by exposure light applied to the other surface is suppressed.

The detailed mechanism is not clear, but can be assumed as follows.

It is considered that in a case where the optical density of the photosensitive resin layer with respect to the exposure wavelength is 0.50 or greater, exposure of the photosensitive resin layer present on one surface to exposure light applied to the other surface is suppressed, and thus exposure fogging on one surface is suppressed.

Further, it is considered that in a case where the optical density of the photosensitive resin layer to the exposure wavelength is 2.50 or less, exposure light reaches a deep portion of the photosensitive resin layer on the exposed surface, and thus the etching resist to be obtained has an excellent pattern shape.

Further, in the pattern formation method according to the embodiment of the present disclosure, it is considered that since exposure fogging on one surface can be suppressed by setting the optical density of the photosensitive resin layer to a specific value, the exposure fogging is suppressed even in a case where an additional step of forming an opaque layer as described in JP2011-154080A is not performed.

In other words, it is considered that a pattern formation method with excellent productivity is provided.

Hereinafter, each step in the pattern formation method according to the embodiment of the present disclosure will be described in detail.

<Step of Preparing Base Material>

The pattern formation method according to the embodiment of the present disclosure includes a step of preparing a base material which has an etching layer transparent to an exposure wavelength on two surfaces thereof and is transparent to the exposure wavelength.

The step of preparing a base material may be a step of using a base material which has been obtained in a state in which an etching layer is provided on each surface or a step of producing a base material by forming an etching layer on the base material.

[Base Material]

The base material is not particularly limited, but a base material having at least two surfaces is used, and a plate-like base material such as a film-like base material or a sheet-like base material is preferable.

Further, as the base material, a base material transparent to an exposure wavelength is used.

The base material transparent to the exposure wavelength indicates a base material whose transmittance to the exposure wavelength is 50% or greater, a base material whose transmittance to the exposure wavelength is 60% or greater is preferable, and a base material whose transmittance to the exposure wavelength is 80% or greater is more preferable.

The upper limit of the transmittance is not particularly limited and may be 100% or less.

The transmittance at the exposure wavelength is measured using a commercially available transmittance measuring device (for example, V-700 series, manufactured by Jasco Corporation).

Further, in the present disclosure, the exposure wavelength indicates a wavelength with the highest intensity among the light included in the exposure light.

The material of the base material is not particularly limited, and examples thereof include base materials formed of a polyester-based resin such as polyethylene terephthalate; a resin material using polyether ether ketone, an acrylic resin, a cyclopolyolefin-based resin, or a polycarbonate-based resin; and an inorganic material such as glass or quartz.

As the base material used in the present disclosure, a base material containing the resin material is preferable, and a resin film is more preferable.

In a case where the etching layer is a layer having conductivity described below, it is preferable that the base material is a base material having an insulation property.

In the present disclosure, the conductivity indicates a property in which the surface electrical resistance value of a layer having the conductivity is preferably in a range of 0.1 $\omega/\square$ 1000 $\omega/\square$. The insulation property indicates a property in which the surface electrical resistance value is less than 0.1 $\omega/\square$.

The surface resistance value is measured using a commercially available resistivity measuring device (for example, LORESTA-GX MCP-T700, manufactured by Mitsubishi Chemical Analytech Co., Ltd.).

Further, in a case where the base material is used for production of a touch sensor in a touch panel, the thickness of the base material is preferably in a range of 10 μm to 300 μm and more preferably in a range of 30 μm to 150 μm.

Etching Layer

The base material in the present disclosure includes an etching layer on each surface.

It is preferable that the etching layer has conductivity. The expression "the etching layer has conductivity" also means that the etching layer is a conductive layer.

In other words, as the pattern formation method according to the embodiment of the present disclosure, a conductive pattern formation method is preferable, and a method of forming a conductive wiring pattern is more preferable.

Further, it is preferable that the conductive pattern formation method is a pattern formation method for a touch panel sensor.

The etching layer is not particularly limited. From the viewpoint of having the conductivity, the etching layer may contain a metal oxide such as $In_2O_3$, $SnO_2$, or an indium tin oxide (ITO) and may also contain a zinc oxide (ZnO), an indium zinc oxide (IZO), a gallium zinc oxide (GZO), or an aluminum zinc oxide (AZO).

Further, as the etching layer, a metal mesh or a metal nanowire layer which is known in the field of touch panels can also be suitably used. Examples of the metal include silver and copper.

The etching layer is not particularly limited and can be produced according to a known method. For example, the etching layer can be formed on the base material according to a physical vapor deposition (PVD) method, a chemical vapor deposition (CVD) method, or a coating method.

The materials of two etching layers may be the same as or different from each other, but it is preferable that the materials of two etching layers are the same as each other from the viewpoint that the etching layers are preferably simultaneously removed from two surfaces in the step of removing the etching layers described below.

Further, an etching layer transparent to an exposure wavelength is used as the etching layer.

The etching layer transparent to the exposure wavelength indicates an etching layer whose transmittance to the exposure wavelength is 50% or greater, an etching layer whose transmittance to the exposure wavelength is 60% or greater is preferable, and an etching layer whose transmittance to the exposure wavelength is 80% or greater is more preferable.

The upper limit of the transmittance is not particularly limited and may be 100% or less.

The transmittance at the exposure wavelength is measured according to the same method as that for the base material.

Further, the thickness of the etching layer is not particularly limited, but is preferably in a range of 5 nm to 1000 nm and more preferably in a range of 10 nm to 300 nm.

<Step of Forming Photosensitive Resin Layer>

The pattern formation method according to the embodiment of the present disclosure includes a step of respectively forming a photosensitive resin layer, in which an optical density to the exposure wavelength is in a range of 0.50 to 2.50, on each etching layer on two surfaces of the base material.

Two photosensitive resin layers formed on two etching layers may have the same composition or different compositions, but it is preferable that two photosensitive resin layers have the same composition from the viewpoint that the development described below is performed simultaneously.

[Photosensitive Resin Layer]

The photosensitive resin layer in the present disclosure may be a so-called negative type photosensitive resin layer whose removability in development is decreased upon exposure or a so-called positive type photosensitive resin layer whose removability in development is increased upon exposure, but it is preferable that the photosensitive resin layer is a negative type photosensitive resin layer.

Optical Density (OD Value)

In the photosensitive resin layer of the present disclosure, the optical density to the exposure wavelength is in a range of 0.50 to 2.50.

Further, from the viewpoint of obtaining a resist pattern having an excellent pattern shape, the optical density thereof is preferably 2.30 or less and more preferably 2.00 or less.

In a case where the photosensitive resin layer is a negative type photosensitive resin layer and the optical density thereof is in the above-described range, occurrence of so-called undercuts in the resist pattern is suppressed.

From the viewpoints of the peeling property of the resist pattern and suppressing exposure fogging, the optical density thereof is preferably 0.70 or greater and more preferably 1.00 or greater.

In the present disclosure, the optical density is measured using a spectrophotometer (V-7000, manufactured by Jasco Corporation).

Thickness

From the viewpoint of suppressing occurrence of undercuts, the thickness of the photosensitive resin layer in the present disclosure is preferably 15.0 μm or less and more preferably 8.0 μm or less. Further, from the viewpoint of preventing exposure fogging, the thickness thereof is preferably 1.0 μm or greater and more preferably 2.0 μm or greater.

Composition of Photosensitive Resin Layer

It is preferable that the photosensitive resin layer in the present disclosure contains a polymerizable compound and a polymerization initiator.

In addition, from the viewpoint of easily adjusting the optical density to be in the above-described range, it is preferable that the photosensitive resin layer in the present disclosure contains an ultraviolet absorbing material.

Hereinafter, each component contained in the photosensitive resin layer in the present disclosure will be described, but the present disclosure is not limited to the following examples of each component, and a component obtained by adding the following ultraviolet absorbing material to a known photosensitive resin layer used for production of a touch panel so that the optical density thereof is adjusted to be in the above-described range can be used without particular limitation.

<<Polymerizable Compound>>

The polymerizable compound is not particularly limited, but a radically polymerizable compound is preferable, and an ethylenically unsaturated compound is preferable.

The ethylenically unsaturated compound may be monofunctional or polyfunctional, but a bi- or higher functional ethylenically unsaturated compound is preferable from the viewpoint of obtaining a resist pattern having an excellent pattern shape.

Further, as the ethylenically unsaturated compound, a (meth)acrylate compound is preferable, and a bi- or higher functional (meth)acrylate compound is more preferable.

Examples of the polymerizable compound include monofunctional acrylate and monofunctional methacrylate such as polyethylene glycol mono(meth)acrylate, polypropylene glycol mono(meth)acrylate, and phenoxyethyl (meth)acrylate; polyethylene glycol di(meth)acrylate, polypropylene glycol di(meth)acrylate, trimethylolethane triacrylate, trimethylolpropane triacrylate, trimethylolpropane diacrylate, neopentyl glycol di(meth)acrylate, pentaerythritol tetra(m- eth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl) ether, tri(acryloyloxyethyl) isocyanurate, tri(acryloyloxyethyl) cyanurate, glycerin tri(meth)acrylate; and polyfunctional acrylate and polyfunctional methacrylate such as those obtained by adding ethylene oxide and propylene oxide to polyfunctional alcohol such as trimethylolpropane or glycerin and (meth)acrylating the resulting solution.

Further, a urethane-based monomer such as a urethane (meth)acrylate compound can also be preferably used.

Other examples thereof include polyfunctional acrylate and polyfunctional methacrylate such as urethane acrylates described in JP1973-041708B (JP-S48-041708B), JP1975-006034B (JP-S50-006034B), and JP1976-037193A (JP-S51-037193A); polyester acrylates described in JP1973-064183A (JP-S48-064183A), JP1974-043191B (JP-S49-043191B), and JP1977-030490B (JP-S52-030490B); and epoxy acrylates which are reaction products of an epoxy resin and (meth)acrylic acid.

As the polymerizable compound, a commercially available product placed on the market may be used. Preferred examples of the commercially available product include tricyclodecane dimethanol diacrylate (A-DCP, manufactured by Shin-Nakamura Chemical Co., Ltd, bifunctional, molecular weight of 304), tricyclodecane dimethanol dimethacrylate (DCP, manufactured by Shin-Nakamura Chemical Co., Ltd, bifunctional, molecular weight of 332), 1,9-nonanediol diacrylate (A-NOD-N, manufactured by Shin-Nakamura Chemical Co., Ltd, bifunctional, molecular weight of 268), 1,6-hexanediol diacrylate (A-HD-N, manufactured by Shin-Nakamura Chemical Co., Ltd, bifunctional, molecular weight of 226), 9,9-bis[4-(2-acryloyloxyethoxy)phenyl]fluorene (A-BPEF, manufactured by Shin-Nakamura Chemical Co., Ltd, bifunctional, molecular weight of 546), urethane acrylate (UA-160TM, manufactured by Shin-Nakamura Chemical Co., Ltd, bifunctional, molecular weight of 1600), 1,6-hexanediol diacrylate (V #230, manufactured by Osaka Organic Chemical Industry Ltd., bifunctional, molecular weight of 226), 1,3-adamantyl diacrylate (ADDA, manufactured by Mitsubishi Gas chemical Co., Ltd., bifunctional, molecular weight of 276), trimethylolpropane triacrylate (A-TMPT, manufactured by Shin-Nakamura Chemical Co., Ltd, trifunctional, molecular weight of 296), trimethylolpropane ethylene oxide (EO)-modified (n≈1) triacrylate (M-350, manufactured by Toagosei Co., Ltd., trifunctional), pentaerythritol tetraacrylate (A-TMMT, manufactured by Shin-Nakamura Chemical Co., Ltd, tetrafunctional, molecular weight of 352), dipentaerythritol hexaacrylate (A-DPH, manufactured by Shin-Nakamura Chemical Co., Ltd, hexafunctional, molecular weight of 578), a pentaerythritol triacrylate hexamethylene diisocyanate urethane prepolymer (UA-306H, manufactured by Kyoeisha Chemical Co., Ltd., hexafunctional), a pentaerythritol triacrylate toluene diisocyanate urethane prepolymer (UA306T, manufactured by Kyoeisha Chemical Co., Ltd., hexafunctional), dipentaerythritol hexaacrylate (KAYARAD DPHA, manufactured by Nippon Kayaku Co., Ltd., hexafunctional, molecular weight of 579), urethane (meth)acrylate (UA-32P, manufactured by Shin-Nakamura Chemical Co., Ltd, nonafunctional), and urethane (meth)acrylate (8UX-015A, manufactured by Tasei Fine Chemical Co., Ltd., pentadecafunctional).

The molecular weight of the polymerizable compound is preferably 3000 or less, more preferably 2000 or less, still more preferably 1000 or less, and particularly preferably 500 or less.

The lower limit of the molecular weight is not particularly limited, but is preferably 100 or greater.

The molecular weight of the polymerizable compound can be acquired from the molecular formula obtained by identifying the molecular structure based on the mass spectrometry (for example, liquid chromatograph (LC/MS) analysis, gas chromatograph (GC/MS) analysis, or fat atom bombardment (FAB/MS) analysis).

The content of the polymerizable compound contained in the photosensitive resin layer is preferably in a range of 5% by mass to 70% by mass, more preferably in a range of 10% by mass to 40% by mass, and still more preferably in a range of 10% by mass to 30% by mass with respect to the amount of the total solid content in the photosensitive resin layer. In the present disclosure, the amount of the total solid content in the photosensitive resin layer indicates the mass obtained by removing the mass of volatile components such as a solvent and the like from the mass of the photosensitive resin layer.

The polymerizable compound may be used alone or in combination of two or more kinds thereof. It is preferable that a combination of two or more kinds of polymerizable compounds is used from the viewpoint of further improving the sensitivity during pattern formation. Further, from the viewpoints of the film hardness and suppressing residues, it is preferable to combine a bifunctional polymerizable compound and a polymerizable compound other than a bifunctional polymerizable compound.

In a case where a combination of a bifunctional polymerizable compound and a polymerizable compound other than a bifunctional polymerizable compound is used, the ratio (the total mass of the bifunctional polymerizable compound and the polymerizable compound) of the mass of the bifunctional polymerizable compound to the total mass of the polymerizable compounds (the total amount of the bifunctional polymerizable compound and the polymerizable compound other than a bifunctional polymerizable compound) is preferably 50% by mass or greater.

It is advantageous that the ratio thereof (mass of bifunctional polymerizable compound/total mass of polymerizable compound) is 50% by mass or greater from the viewpoints of the film hardness and suppressing development residues resulting from a weak alkaline developer (such as a sodium carbonate aqueous solution).

<<Polymerization Initiator>>

It is preferable that the photosensitive resin layer contains at least one polymerization initiator.

Examples of the polymerization initiator include polymerization initiators described in paragraphs 0031 to 0042 of JP2011-095716A and oxime-based polymerization initiators described in paragraphs 0064 to 0081 of JP2015-014783A.

As the polymerization initiator, a commercially available product placed on the market can be used. Preferred examples of the commercially available product include 1,2-octanedione-1-[4-(phenylthio)-2-(O-benzoyloxime)] (trade name: IRGACURE OXE-01, manufactured by BASF SE), ethane-1-one, [9-ethyl-6-(2-methylbenzoyl)-9H-carbazole-3-yl]-1-(O-acetyloxime) (trade name: IRGACURE OXE-02, manufactured by BASF SE), 2-(dimethylamino)-2-[(4-methylphenyl)methyl]-1-{4-(4-morpholinyl)phenyl}-1-butanone (trade name: IRGACURE 379EG, manufactured by BASF SE), 2-methyl-1-(4-methylthiophenyl)-2-morpholinopropane-1-one (trade name: IRGACURE 907, manufactured by BASF SE), 2-hydroxy-1-{4-[4-(2-hydroxy-2-methyl-propionyl)-benzyl]phenyl}-2-methyl-propane-1-one (trade name: IRGACURE 127, manufactured by BASF SE), 2-benzyl-2-dimethylamino-1-(4-morpholinophenyl)-butanone-1 (trade name: IRGACURE 369, manufactured by BASF SE), 2-hydroxy-2-methyl-1-phenyl-propane-1-one (trade name: IRGACURE 1173, manufactured by BASF SE), 1-hydroxy-cyclohexyl-phenyl-ketone (trade name: IRGACURE 184, manufactured by BASF SE), 2,2-dimethoxy-1,2-diphenylethane-1-one (trade name: IRGACURE 651, manufactured by BASF SE), Lunar 6 (trade name of oxime ester-based polymerization initiator, manufactured by DKSH Holding AG), 2,4-diethylthioxanthone (trade name: KAYACURE DETX-S, manufactured by Nippon Kayaku Co., Ltd.), and DFI-091 and DFI-020 (both fluorene oxime-based polymerization initiators, manufactured by Daito Chemix Co., Ltd.).

Among these, from the viewpoint of improving the sensitivity, an oxime-based polymerization initiator such as an α-aminoalkylphenone-based compound, an α-hydroxyalkylphenone-based compound, or an oxime ester-based compound is preferable. Further, it is more preferable that the photosensitive resin layer contains an oxime-based polymerization initiator.

The photosensitive resin layer according to the present disclosure may contain one or two or more kinds of polymerization initiators.

The content of the polymerization initiator contained in the photosensitive resin layer is preferably in a range of 0.01% by mass to 5% by mass and more preferably in a range of 0.05% by mass to 3% by mass with respect to the amount of the total solid contents in the photosensitive resin layer.

From the viewpoint of further suppressing development residues and effectively suppressing deposition of the polymerization initiator from the photosensitive resin layer, the ratio (polymerization initiator/polymerizable compound) of the amount of the content of the polymerization initiator to the amount of the content of the above-described polymerizable compound in the photosensitive resin layer is preferably in a range of 0.05 to 0.60, more preferably in a range of 0.05 to 0.50, and still more preferably in a range of 0.07 to 0.30.

<<Ultraviolet Absorbing Material>>

From the viewpoint of adjusting the optical density of the photosensitive resin layer to the exposure wavelength to be in the above-described range, it is preferable that the photosensitive resin layer in the present disclosure contains an ultraviolet absorbing material.

Examples of the ultraviolet absorbing material include ultraviolet absorbing materials such as a benzophenone compound, a benzotriazole compound, a benzoate compound, a salicylate compound, a triazine compound, and a cyanoacrylate compound. Specific examples of the benzotriazole compound include 2-(2H-benzotriazole-2-yl)-p-cresole, 2-(2H-benzotriazole-2-yl)-4-6-bis(1-methyl-1-phenylethyl)phenol, 2-[5-chloro(2H)-benzotriazole-2-yl]-4-methyl-6-(tert-butyl)phenol, 2-(2H-benzotriazole-yl)-4,6-di-tert-pentylphenol, and 2-(2H-benzotriazole-2-yl)-4-(1,1,3,3-tetramethylbutyl)phenol, mixtures thereof, modified products thereof, polymers thereof, and derivatives thereof. Further, examples of the triazine compound include 2-(4,6-diphenyl-1,3,5-triazine-2-yl)-5-[-(hexyl)oxy]-phenol, 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2,4-bis(2,4-dimethylphenyl)-6-(2-hydroxy-4-isooctyloxyphenyl)-s-triazine, mixtures thereof, modified products thereof, polymers thereof, and derivatives thereof These may be used alone or in the form of a mixture of a plurality of kinds thereof.

Further, it is preferable that the photosensitive resin layer according to the present disclosure contains carbon black as an ultraviolet absorbing material. As the carbon black, known carbon black can be used without particular limitation as long as the optical density is set to be in the above-described range, and a commercially available product may be used.

The photosensitive resin layer according to the present disclosure may contain one or two or more kinds of ultraviolet absorbing materials.

The content of the ultraviolet absorbing material is not particularly limited and may be appropriately set to a value such that the optical density of the photosensitive resin layer is set to a desired value.

<<Alkali-Soluble Resin>>

It is preferable that the photosensitive resin layer according to the present disclosure contains an alkali-soluble resin.

The "alkali-soluble resin" can be used without particular limitation as long as the resin is dissolved or dispersed in a developer used in the step of forming a resist pattern described below.

Specific examples of the alkali-soluble resin include a random copolymer of benzyl (meth)acrylate and (meth)acrylic acid, a random copolymer of styrene and (meth)acrylic acid, a copolymer of cyclohexyl (meth)acrylate, (meth)acrylic acid, and methyl (meth)acrylate, a glycidyl (meth)acrylate adduct of a copolymer of cyclohexyl (meth)acrylate, methyl (meth)acrylate, and (meth)acrylic acid, a glycidyl (meth)acrylate adduct of a copolymer of benzyl (meth)acrylate and (meth)acrylic acid, a copolymer of allyl (meth)acrylate and (meth)acrylic acid, and a copolymer of benzyl (meth)acrylate, (meth)acrylic acid, and hydroxyethyl (meth)acrylate.

Other examples of the alkali-soluble resin include resins described in paragraph 0025 of JP2011-095716A and resins described in paragraphs 0033 to 0052 of JP2010-237589A.

The weight-average molecular weight of the alkali-soluble resin is preferably in a range of 8000 to 100000.

In the present disclosure, the weight-average molecular weight is measured by gel permeation chromatograph (GPC). The calibration curve is prepared from eight samples of "Standard samples TSK standard, polystyrene" (manufactured by Tosoh Corporation), which are "F-40", "F-20", "F-4", "F-1", "A-5000", "A-2500", "A-1000", and "n-propylbenzene".

<Conditions>
GPC: HLC (registered trademark)-8020GPC (manufactured by Tosoh Corporation)
Columns: three columns of TSKgel (registered trademark) and Super Multipore HZ-H (manufactured by Tosoh Corporation, 4.6 mmID×15 cm)
Eluent: tetrahydrofuran (THF)
Sample concentration: 0.45% by mass
Flow rate: 0.35 mL/min
Sample injection amount: 10 μL
Measurement temperature: 40° C.
Detector: differential refractometer (RI)

The photosensitive resin layer according to the present disclosure may contain one or two or more kinds of alkali-soluble resins.

The content of the alkali-soluble resin is preferably in a range of 10% by mass to 70% by mass, more preferably in a range of 15% by mass to 60% by mass, and still more preferably in a range of 20% by mass to 50% by mass with respect to the amount of the total solid content in the photosensitive resin layer.

<<Other Components>>

The photosensitive resin layer according to the present disclosure may contain a sensitizer, a surfactant, and the like as other components.

Sensitizer

Examples of the sensitizer include known sensitizing dyes, dyes, pigments, thiol compounds, and amino acid compounds. The sensitizer may be used alone or in combination of two or more kinds thereof.

Examples of the sensitizing dye include a dialkylaminobenzophenone compound, a pyrazoline compound, an anthracene compound, a coumarin compound, a xanthone compound, a thioxanthone compound, an oxazole compound, a benzoxazole compound, a thiazole compound, a benzothiazole compound, a triazole compound (such as 1,2,4-triazole), a stilbene compound, a triazine compound, a thiophene compound, a naphthalimide compound, a triallylamine compound, and an aminoacridine compound.

Examples of the dye and the pigment include fuchsine, phthalocyanine green, an auramine base, chalcoxide green S, paramagenta, crystal violet, methyl orange, Nile blue 2B, Victoria blue, Malachite Green (manufactured by Hodogaya Chemical Co., Ltd., AIZEN (registered trademark), MALACHITE GREEN), basic blue 20, and Diamond Green (manufactured by Hodogaya Chemical Industry Co., Ltd. AIZEN (registered trademark), DIAMOND GREEN GH).

As the dye, a coloring dye can be used. The coloring dye is a compound having a coloring function at the time of being irradiated with light. Examples thereof include a lueco dye and a fluoran dye. Among these, a lueco dye is preferable. Specific examples thereof include tris(4-dimethylamino-2-methylphenyl)methane [lueco crystal violet] and tris(4-dimethylamino-2-methylphenyl)methane [lueco malachite green].

It is preferable that the lueco dye is used by being combined with a halogen compound. Examples of the halogen compound include amyl bromide, isoamyl bromide, isobutylene bromide, ethylene bromide, diphenylmethyl bromride, benzal bromide, methylene bromide, tribromomethylphenyl sulfone, carbon tetrabromide, tris(2,3-dibromopropyl)phosphate, trichloroacetamide, amyl iodide, isobutyl iodide, 1,1,1-trichloro-2,2-bis(p-chlorophenyl)ethane, hexachloroethane, a halogenated triazine compound. Examples of the halogenated triazine compound include 2,4,6-tris(trichloromethyl)-s-triazine and 2-(4-methoxyphenyl)-4,6-bis(trichloromethyl)-s-triazine. Among these, tribromomethylphenyl sulfone or a triazine compound is useful.

Further, a thiol compound is another preferred example of the sensitizer. The thiol compound is effective for further improving the sensitivity of a photopolymerization initiator with respect to a light source and suppressing inhibition of polymerization of a polymerizable compound due to oxygen.

Examples of the thiol compound include a polyfunctional thiol compound such as ethylene glycol bisthiopropionate (EGTP), butanediol bisthiopropionate (BDTP), trimethylolpropane tristhiopropionate (TMTP), or pentaerythritol tetrakisthiopropionate (PETP); and a monofunctional thiol compound such as 2-mercaptobenzothiazole, 2-mercaptobenzoxazole, 2-mercaptobenzimidazole, 2-mercapto-4(3H)-quinazoline, β-mercaptonaphthalene, or N-phenyl-mercaptobenzimidazole.

A commercially available product may be used as the sensitizer, and examples thereof include polyfunctional thiol (trade name: KARENZ MT (registered trademark), BD1, manufactured by Showa Denko K. K.).

Further, other examples of the sensitizer include amino acid compounds (such as N-phenylglycine), organic metal compounds (such as tributyltin acetate) described in JP1973-042965B (JP-S48-042965B), hydrogen donors described in JP1980-034414B (JP-S55-034414B), and sulfur compounds described in JP1994-308727A (JP-H06-308727A).

The content of the sensitizer is preferably in a range of 0.01% by mass to 5% by mass and more preferably in a range of 0.05% by mass to 1% by mass with respect to the total mass of the photosensitive resin layer.

Surfactant

The photosensitive resin layer according to the present disclosure may contain a surfactant.

Examples of the surfactant include a silicone-based surfactant and a fluorine-based surfactant.

Examples of the silicone-based surfactant include a surfactant having a siloxane bond. Specific examples thereof include Toray silicone DC3PA, Toray silicone SH7PA, Toray silicone DC11PA, Toray silicone SH21PA, Toray silicone SH28PA, Toray silicone 29SHPA, Toray silicone SH3OPA, and polyether-modified silicone oil SH8400 (all trade names, manufactured by Toray Silicone Co., Ltd.), KP321, KP322, KP323, KP324, KP326, KP340, KP341, KF6001, KF6002, KF6003, and X22-160AS (manufactured by Shin-Etsu chemical Co., Ltd.), and TSF400, TSF401, TSF410, TSF4300, TSF4440, TSF4445, TSF-4446, TSF4452, and TSF4460(manufactured by GE Toshiba Silicones Co., Ltd.).

Further, examples of the fluorine-based surfactant include a surfactant having a fluorocarbon chain. Specific examples thereof include FLUORINERT FC430 and FLUORINERT FC431 (both trade names, manufactured by 3M Japan Ltd.); MEGAFACE F142D, MEGAFACE F171, MEGAFACE F172, MEGAFACE F173, MEGAFACE F177, MEGAFACE F780F, MEGAFACE F781F, MEGAFACE F479, MEGAFACE F482, MEGAFACE F551A, MEGAFACE F553, MEGAFACE F554, MEGAFACE F486, MEGAFACE F478, MEGAFACE F480, MEGAFACE F484, MEGAFACE F470, MEGAFACE F471, MEGAFACE F483, MEGAFACE F489, MEGAFACE F487, MEGAFACE F444, MEGAFACE F183, and MEGAFACE R30 (all trade names, manufactured by DIC Corporation); EFTOP EF301, EFTOP EF303, EFTOP EF351, and EFTOP EF352 (all trade names, manufactured by Shin-Akita Kasei K. K.); SURFLON 5381, SURFLON 5382, SURFLON SC101, and SURFLON SC105 (all trade names, manufactured by AGC Inc.); E5844 (trade name, manufactured by Daikin Fine Chemical laboratory Co., Ltd.); and BM-1000 and BM-1100 (both trade names, manufactured by BM Chemie Co., Ltd.).

Further, other examples thereof include a silicone-based surfactant having a fluorine atom with a siloxane bond and a fluorocarbon chain. Specific examples thereof include MEGAFACE R08, MEGAFACE BL20, MEGAFACE F475, MEGAFACE F477, and MEGAFACE F443 (all trade names, manufactured by DIC Corporation).

These other surfactants may be used alone or in combination of two or more kinds thereof.

[Method of Forming Photosensitive Resin Layer]

A method of forming the photosensitive resin layer according to the present disclosure is not particularly limited, and examples thereof include a method of using a transfer film and a method of dissolving each component contained in the above-described photosensitive resin layer in a solvent to prepare a photosensitive resin composition, coating the above-described etching layer with the composition, and drying the composition. Among these, the method of using a transfer film is preferable.

In a case where a transfer film is used, it is preferable that the step of forming a photosensitive resin layer is a step of laminating a transfer film, which includes a temporary support and a photosensitive resin layer having an optical density of 0.50 to 2.50 on the temporary support, on the etching layer.

Hereinafter, the transfer film will be described in detail.

Transfer Film

It is preferable that the transfer film used in the present disclosure includes a temporary support and a photosensitive resin layer.

FIG. 1 is a schematic cross-sectional view illustrating an example of the configuration of a transfer film according to an embodiment of the present invention.

A transfer film 10 illustrated in FIG. 1 includes a temporary support 12, a photosensitive resin layer 14, and a protective film (protective release layer) 16 in this order. FIG. 1 illustrates an aspect in which the temporary support 12, the photosensitive resin layer 14, and the protective film 16 are adjacently laminated on each other, but the present invention is not limited thereto. As described below, an aspect in which a functional layer (not illustrated) may be further provided between the temporary support 12 and the photosensitive resin layer 14 or an aspect in which a thermoplastic resin layer (not illustrated) is further provided between the photosensitive resin layer 14 and an optionally provided functional layer can be employed.

In a case where the transfer film includes a functional layer, a thermoplastic resin layer, and the like, the functional layer, the thermoplastic resin layer, and the like are formed in addition to the photosensitive resin layer in the step of forming the photosensitive resin layer in the present disclosure.

<<Photosensitive Resin Layer in Transfer Film>>

The photosensitive resin layer in the transfer film used in the present disclosure is the same layer as the above-described photosensitive resin layer formed on the etching layer in the present disclosure, and the preferable aspects thereof are the same as described above.

This is because the photosensitive resin layer is formed by laminating the photosensitive resin layer in the transfer film used in the present disclosure on the etching layer.

<<Temporary Support>>

The transfer film includes a temporary support.

A material having flexibility can be used to form the temporary support.

Examples of the temporary support which can be used in the transfer film include resin films such as a cycloolefin copolymer film, a polyethylene terephthalate (PET) film, a cellulose triacetate film, a polystyrene film, and a polycarbonate film. Among these, from the viewpoint of handleability, a PET film is particularly preferable. The temporary support may have a laminated structure of a coating layer and a resin film serving as a base material.

The temporary support may be transparent or colored by containing silicon oxide, alumina sol, a chromium salt, or a zirconium salt.

The conductivity can be imparted to the temporary support using the method described in JP2005-221726A or the like, and the temporary support to which the conductivity has been imparted is suitably used for the transfer film according to the present embodiment.

<<Protective Film>>

It is preferable that the transfer film is formed by further providing a protective film (cover film) on the surface of the above-described photosensitive resin layer for the purpose of protecting the surface from contamination or damage due to impurities such as dust during storage. As the protective film, a film which is easily peeled off from the photosensitive resin layer can be used. Further, the protective film can be suitably selected from films formed of the material which is the same as or similar to the material of the temporary support. Preferred examples of the protective film include a polyolefin film (such as a polypropylene (PP) film or a polyethylene (PE) film), a polyethylene terephthalate (PET) film, silicon paper, and a polytetrafluoroethylene film.

Further, the protective films described in paragraphs [0083] to [0087] and [0093] of JP2006-259138A can be appropriately used.

<<Functional Layer>>

It is preferable that the transfer film has a functional layer between the temporary support and the photosensitive resin layer. Examples of the functional layer include an oxygen blocking film having an oxygen blocking function described in paragraph [0027] of JP4502784B. As the oxygen blocking film, those which exhibit low oxygen permeability and are dispersed or dissolved in water or an alkali aqueous solution are preferable, and the oxygen blocking film can be appropriately selected from known films. Among these, a combination of polyvinyl alcohol and polyvinyl pyrrolidone is preferable.

The dry thickness of the functional layer is preferably in a range of 0.2 µm to 5 µm, more preferably in a range of 0.5 µm to 3 µm, and still more preferably in a range of 1 µm to 2.5 µm.

<<Thermoplastic Resin Layer>>

The transfer film may have a thermoplastic resin layer, described in paragraph [0026] of JP4502784B, between the temporary support and the photosensitive resin layer.

As a component used in the thermoplastic resin layer, the organic polymer material described in JP1993-072724A (JP-HOS-072724A) is preferable.

In a case where the transfer film includes the thermoplastic resin layer, the cushioning property can be imparted to the transfer film, and the transfer property can be improved regardless of a case where the surface to be transferred has unevenness.

The dry thickness of the thermoplastic resin layer is preferably in a range of 2 µm to 30 µm, more preferably in a range of 5 pm to 20 µm, and still more preferably in a range of 7 µm to 16 µm.

<<Method of Producing Transfer Film>>

The transfer film can be prepared in conformity with the method of preparing the curable transfer material described in paragraphs 0094 to 0098 of JP2006-259138A.

In other words, the method of producing the transfer film includes a step of forming the photosensitive resin layer on the temporary support. Further, the method of producing the transfer film may include at least one of a step of forming the functional layer or a step of forming the thermoplastic resin layer before the above-described photosensitive resin layer is formed on the temporary support.

In a case where the transfer film includes the thermoplastic resin layer, it is preferable that the method of producing the transfer film includes a step of forming the functional layer between the thermoplastic resin layer and the photosensitive resin layer after the step of forming the thermoplastic resin layer described above.

In a case where the transfer film having a functional layer is formed, the transfer film can be prepared by coating the temporary support with a solution in which a thermoplastic organic polymer and an additive to be used together as desired are dissolved (a coating solution for a thermoplastic resin layer), drying the solution to obtain a thermoplastic resin layer, coating the obtained thermoplastic resin layer with a coating solution for a functional layer which is prepared by adding a resin and an additive to a solvent that does not dissolve the thermoplastic resin layer, drying the solution, laminating the functional layer thereon, coating the laminated functional layer with a photosensitive resin composition prepared using a solvent that does not dissolve the functional layer, and drying the composition to form a photosensitive resin layer. Further, the components contained in the photosensitive resin composition are as described above.

Laminate

In the step of performing lamination, the transfer film is laminated on the etching layer, and the photosensitive resin layer is transferred to the base material so that a photosensitive resin layer is formed. The lamination can be performed using a known laminator such as a vacuum laminator or an auto-cut laminator.

As the conditions for the lamination, typical conditions can be employed.

The laminate temperature is preferably in a range of 80° C. to 150° C., more preferably in a range of 90° C. to 150° C., and particularly preferably in a range of 100° C. to 150° C.

For example, in a case where a laminator comprising a rubber roller is used, the laminate temperature indicates the temperature of the rubber roller.

<<Optical Density>>

In the pattern formation method according to the embodiment of the present disclosure, in a case where the method includes the step of performing lamination, the optical density of the entire transfer film to be laminated to the exposure wavelength is preferably in a range of 0.50 to 2.50.

From the viewpoint of obtaining a resist pattern having an excellent pattern shape, the optical density thereof is preferably 2.30 or less and more preferably 2.00 or less.

In a case where the photosensitive resin layer is a negative type photosensitive resin layer and the optical density thereof is in the above-described range, occurrence of so-called undercuts in the resist pattern is suppressed.

From the viewpoints of the peeling property of the resist pattern and suppressing exposure fogging, the optical density thereof is preferably 0.70 or greater and more preferably 1.00 or greater.

The optical density of the entire transfer film to be laminated is the optical density of the entire transfer film that is present during exposure in the step of performing pattern exposure.

For example, in a case where the protective film is peeled off from the transfer film, and the transfer film is laminated and exposed, the optical density of the resulting film obtained by peeling the protective film off from the transfer film is measured using a spectrophotometer (V-7000, manufactured by Jasco Corporation).

Further, in a case where the protective film is peeled off from the transfer film, the transfer film is laminated, the temporary support is peeled off from the transfer film, and the resulting film is exposed, the optical density of the resulting film obtained by peeling the temporary support and the protective film off from the transfer film is measured according to the same method as described above.

<Step of Performing Pattern Exposure>

The pattern formation method according to the embodiment of the present disclosure includes a step of pattern-exposing the photosensitive resin layer.

In the step of performing pattern exposure, two photosensitive resin layers formed on two etching layers on two surfaces of the base material (also referred to as the photosensitive resin layers on two surfaces) are respectively exposed.

In the step of performing pattern exposure, it is preferable that the photosensitive resin layers on two surfaces are simultaneously exposed.

Here, the "simultaneous exposure" does not require that the photosensitive resin layers on two surfaces are simultaneously irradiated with exposure light and is satisfied in a case where two surfaces are simultaneously exposed at once in one step.

An aspect in which two surfaces are exposed using a device for exposing two surfaces or an aspect in which one surface and the other surface are continuously exposed using a device for exposing one surface may be exemplified.

In the pattern formation method according to the embodiment of the present disclosure, the photosensitive resin layers on two surfaces can be exposed by different exposure patterns. The different exposure patterns indicate exposure patterns other than the exposure patterns that completely overlap each other on two surfaces of the base material in a case where the base material is observed in the normal direction of the base material.

For example, even in a case where two surfaces of the base material are exposed using masks with the same line and space pattern, various exposure methods such as exposure of two surfaces of the base material by allowing the line directions of the masks to be orthogonal to each other or exposure of two surfaces of the base material by allowing the line directions to be parallel to each other and shifting the positions of the lines can be performed.

Examples of the exposure methods include a method of performing exposure by disposing a mask on which a predetermined pattern has been formed between an exposure light source and the photosensitive resin layer and a method of performing exposure in the form of a pattern by an exposure device without using a mask.

In a case where the step of forming the photosensitive resin layer according to the present disclosure is a step of laminating the transfer film, the photosensitive resin layer may be exposed through the temporary support without peeling the temporary support or the photosensitive resin layer may be exposed by peeling the temporary support. Between these, it is preferable that the photosensitive resin layer is exposed through the temporary support.

[Exposure Light Source]

As the exposure light source, a known light source can be used without particular limitation as long as the source can radiate light in a wavelength range (for example, 365 nm or 405 nm) where the photosensitive resin layer can be sensitized.

It is preferable that the exposure light used in the present disclosure includes light having a wavelength of 365 nm.

Further, it is preferable that the exposure light used in the present disclosure has a maximum wavelength at a wavelength of 365 nm.

Examples of the exposure light source include an ultra-high-pressure mercury lamp, a high-pressure mercury lamp, a metal halide lamp, an ultraviolet light emitting diode (UV-LED), and an ultraviolet laser diode (UV-LD).

[Exposure Amount]

In a case where the optical density of the photosensitive resin layer to the exposure wavelength is set as n, the exposure amount in the step of performing exposure is preferably in a range of $10^{(n-0.5)}$ mJ/cm$^2$ to $10^{(n+1.5)}$ mJ/cm$^2$ and more preferably in a range of $10^n$ mJ/cm$^2$ to $10^{(n+1.0)}$ mJ/cm$^2$.

Further, in the step of performing exposure, it is preferable that the amounts of two photosensitive resin layers to be exposed are respectively in the above-described range.

Further, from the viewpoint of preventing pattern defects (chipping, protruding, thickening, and the like) in the resist pattern to be obtained, the exposure amount in the step of performing exposure is preferably in a range of 10 mJ/cm$^2$ to 500 mJ/cm$^2$ and more preferably in a range of 30 mJ/cm$^2$ to 300 mJ/cm$^2$.

In a case where the exposure light includes light having a plurality of wavelengths, the exposure amount is calculated as the exposure amount of exposure light at a wavelength where the exposure intensity is the highest, among the light included in the exposure light. Further, in a case where the exposure is performed multiple times, the exposure amount is set as the total value of the exposure amounts in the exposure performed multiple times.

<Step of Forming Resist Pattern>

The pattern formation method according to the embodiment of the present disclosure includes a step of developing the photosensitive resin layer to form a resist pattern on two surfaces.

The development method is not particularly limited, and the development may be performed according to a known method. For example, a development method using a developer may be employed.

The developer is not particularly limited, known developers such as the developer described in JP1993-072724A (JP-H05-072724A) can be used.

Further, it is preferable that an alkaline aqueous solution is used as the developer.

Examples of an alkaline compound which can be contained in the alkaline aqueous solution include sodium hydroxide, potassium hydroxide, sodium carbonate, potassium carbonate, sodium hydrogen carbonate, potassium hydrogen carbonate, tetramethylammonium hydroxide, tetraethyl ammonium hydroxide, tetrapropylammonium hydroxide, tetrabutylammonium hydroxide, and choline (2-hydroxyethyltrimethylammonium hydroxide).

The pH of the alkaline aqueous solution at 25° C. is preferably greater than pH 7 and pH 14 or less, more preferably in a range of pH 8 to pH 13, still more preferably in a range of pH 9 to pH12, and particularly preferably in a range of pH 10 to pH 12.

The content of the alkaline compound in the alkaline aqueous solution is preferably in a range of 0.1% by mass to 5% by mass and more preferably in a range of 0.1% by mass to 3% by mass with respect to the total amount of the alkaline aqueous solution.

The developer may contain a known organic solvent.

As the organic solvent, a solvent that is miscible with water or dissolved in water is preferable, and examples thereof include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, c-caprolactam, and N-methylpyrrolidone.

The concentration of the organic solvent is preferably in a range of 0.1% by mass to 30% by mass with respect to the total mass of the developer.

The developer may contain a known surfactant. The concentration of the surfactant is preferably in a range of 0.01% by mass to 10% by mass with respect to the total mass of the developer.

The liquid temperature of the developer is preferably in a range of 20° C. to 40° C.

Examples of the development method include a paddle development method, a shower development method, a shower and spin development method, and a dip development method.

In a case where shower development is performed, the unexposed portion of the photosensitive resin layer is removed by spraying the developer to the pattern-exposed photosensitive resin layer in a shower shape.

Further, it is preferable that development residues are removed after the development by rubbing the residues with a brush or the like while spraying a cleaning agent or the like using a shower.

It is preferable that the development is performed for 10 seconds to 60 seconds.

In the step of performing development, two photosensitive resin layers may be separately developed, but it is preferable that two photosensitive resin layers are developed at once from the viewpoint of the productivity.

The method of developing two photosensitive resin layers at once is not particularly limited, and examples thereof include a method of spraying a developer to two surfaces in a shower shape and a method of immersing the entire base material having two photosensitive resin layers in a developer.

Particularly, a method of supplying a developer to a base material sheet to be transported by spraying a developer from a plurality of nozzles provided on two surfaces of the base material sheet is preferable.

<Heating Step>

The pattern formation method according to the embodiment of the present disclosure may further include a step of heating (post bake) the resist pattern after the development.

In the heating step, it is preferable that two resist patterns (resist patterns on two surfaces) formed of two photosensitive resin layers are heated at once.

In a case where the substrate is a resin substrate, the temperature of the post bake is preferably in a range of 100° C. to 160° C. and more preferably in a range of 130° C. to 160° C.

The strength of the resist patterns is improved by the post bake, and the resistance value of a transparent electrode pattern which is the etching layer can be adjusted.

<Step of Performing Exposure After Resist Pattern Formation>

The pattern formation method according to the embodiment of the present disclosure may further include a step of exposing (post exposure) the resist patterns after the step of performing development.

In a case where the pattern formation method according to the embodiment of the present disclosure includes both the step of performing post bake and the step of performing post exposure, it is preferable that the step of performing post bake is carried out after the step of performing post exposure.

The method of performing post exposure is not particularly limited. For example, the exposure may be performed using the exposure device used in the step of performing exposure.

<Other Steps>

In addition, the pattern formation method according to the embodiment of the present disclosure may further include other known steps such as a step of cleaning the resist pattern after the step of performing development.

<Step of Removing Etching Layer>

The pattern formation method according to the embodiment of the present disclosure includes a step of removing the etching layer on a portion that is not coated with the resist pattern.

The method of removing the etching layer is not particularly limited, and a known etching method such as the method described in paragraphs 0048 to 0054 of JP2010-152155A can be used.

Examples of the etching method include a wet etching method of performing immersion in an etching solution which has been typically carried out. The etching solution used in the wet etching may be appropriately selected depending on the thickness or the material of the etching layer in which an acidic or alkaline etching solution is used according to the etching target.

Examples of the acidic etching solution include an aqueous solution containing only an acidic component such as hydrochloric acid, sulfuric acid, nitric acid, acetic acid, hydrofluoric acid, oxalic acid, or phosphoric acid; and a mixed aqueous solution of an acidic component and a salt such as iron (II) chloride, ammonium fluoride, or potassium permanganate. As the acidic component, a component obtained by combining a plurality of acidic components may be used.

Examples of the alkaline etching solution include an aqueous solution containing only an alkali component such as sodium hydroxide, potassium hydroxide, ammonia, an organic amine, or a salt of an organic amine such as tetramethylammonium hydroxide; and a mixed aqueous solution of an alkali component and a salt of potassium permanganate. As the alkali component, a component obtained by combining a plurality of alkali components may be used.

The temperature of the etching solution is not particularly limited, but is preferably 45° C. or lower. In the present disclosure, it is preferable that the resist pattern used as an etching mask (etching pattern) exhibits particularly excellent resistance with respect to an acidic or alkaline etching solution at a temperature of 45° or lower.

<Cleaning Step and the Like>

The pattern formation method may include a step of cleaning the metal substrate (cleaning step) and a step of drying the metal substrate (drying step) as necessary after the etching step for the purpose of preventing contamination of the process line.

In the cleaning step, for example, the substrate may be cleaned with pure water at room temperature (10° C. to 35° C.) for 10 seconds to 300 seconds.

In the drying step, for example, the substrate may be dried by appropriately adjusting the air blow pressure (approximately 0.1 kg/cm$^2$ to 5 kg/cm$^2$) using an air blow device.

In the step of removing the etching layer, two etching layers present on two surfaces of the base material may be separately removed, but it is preferable that two etching layers are removed at once from the viewpoint of the productivity.

The method of developing two photosensitive resin layers at once is not particularly limited, and the photosensitive resin layers can be developed at once using a method of supplying the etching solution to two surfaces.

<Peeling Step>

The pattern formation method according to the embodiment of the present disclosure includes a step of peeling the resist pattern.

The peeling method is not particularly limited, and it is preferable to use a known peeling solution.

Examples of the peeling solution include a peeling solution obtained by dissolving an inorganic alkali component such as sodium hydroxide or potassium hydroxide or an organic alkali component such as a tertiary amine or a quaternary ammonium salt in water, dimethyl sulfoxide, N-methylpyrrolidone, or a mixed solution thereof.

The resist pattern can be peeled using a peeling solution according to a spray method, a shower method, or a paddle method.

In the peeling step, two resist patterns present on the etching layers on two surfaces of the base material may be separately removed, but it is preferable that two resist patterns are peeled at once from the viewpoint of the productivity.

The method of developing two photosensitive resin layers at once is not particularly limited, and the photosensitive resin layers can be developed at once using a method of supplying the peeling solution to two surfaces.

<Other Steps>

The pattern formation method according to the embodiment of the present disclosure may further include other known steps such as a cleaning step after the peeling step.

(Touch Panel, Touch Panel Display Device, and Production Method Thereof)

A touch panel according to the present disclosure is a touch panel having at least the pattern produced using the pattern formation method according to the embodiment of the present disclosure as a sensor electrode pattern.

Atouch panel display device according to the present disclosure is a touch panel display device having at least the pattern produced using the pattern formation method according to the embodiment of the present disclosure as a sensor electrode pattern, and a touch panel display device including the touch panel according to the present disclosure is preferable.

It is preferable that a method of producing the touch panel or the touch panel display device according to the embodiment of the present disclosure includes the pattern formation method according to the embodiment of the present disclosure.

As a detection method for the touch panel according to the present disclosure and the touch panel display device according to the present disclosure, any known method such as a resistive film method, an electrostatic capacitance method, an ultrasonic method, an electromagnetic induction method, or an optical method may be used. Among these, the capacitance method is preferable.

Specifically, according to the method of producing the touch panel according to the embodiment of the present disclosure, it is possible to produce a touch panel in which a pattern formed on one surface of the base material is a position detection electrode of an X-axis direction and a pattern formed on the other surface of the base material is a position detection electrode of a Y-axis direction.

(Laminate)

A laminate according to the embodiment of the present disclosure includes a base material which is transparent to an exposure wavelength, two etching layers which are respectively disposed on two surfaces of the base material and are transparent to the exposure wavelength, and two photosensitive resin layers which are respectively disposed on the two etching layers and in which the optical density to the exposure wavelength is in a range of 0.50 to 2.50.

The laminate according to the embodiment of the present disclosure will be described with reference to FIG. 2.

Figure 2:
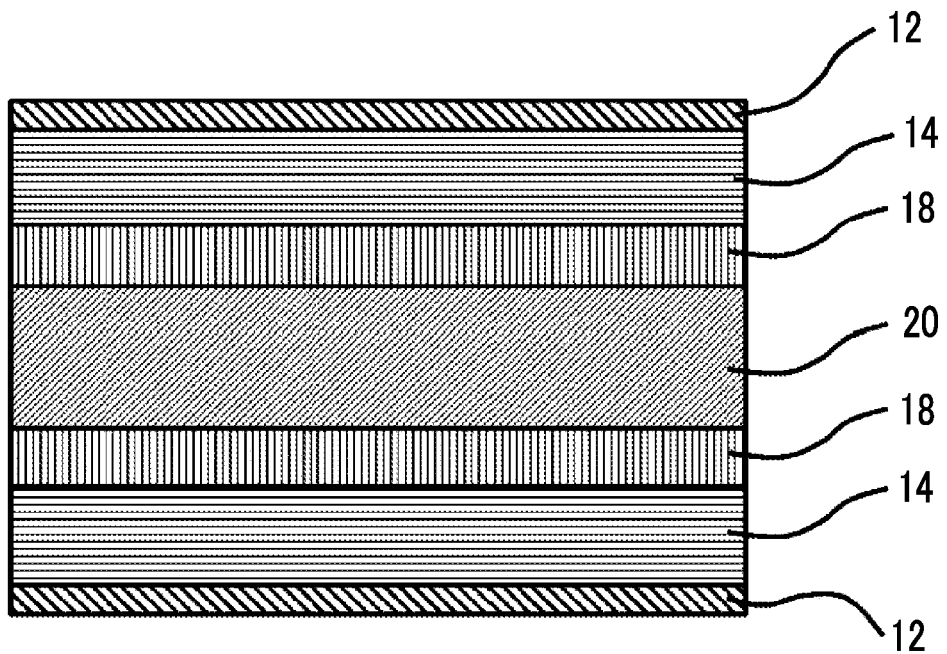
FIG. 2 is a schematic view illustrating an example of a laminate according to the present disclosure.

FIG. 2 is a schematic view illustrating an example of the laminate according to the present disclosure.

Two etching layers 18 transparent to the exposure wavelength are disposed on both sides of a base material 20 transparent to the exposure wavelength, and two photosensitive resin layers 14 in which the optical density to the exposure wavelength is in a range of 0.50 to 2.50 are respectively disposed on the two etching layers.

The laminate according to the embodiment of the present disclosure can be produced according to a method including a step of preparing the base material and a step of forming the photosensitive resin layer in the pattern formation method according to the embodiment of the present disclosure. Particularly, in the laminate according to the embodiment of the present disclosure, it is preferable that the step of forming the photosensitive resin layer is the step of laminating the transfer film described above.

The laminate including a temporary support 12 illustrated in FIG. 2 can be prepared by producing the laminate according to the embodiment of the present disclosure using the method including the step of performing lamination. The laminate according to the embodiment of the present disclosure may or may not include the temporary support 12.

The base material, the etching layer, the photosensitive resin layer, and the temporary support in the laminate according to the embodiment of the present disclosure are the same as the base material, the etching layer, the photosensitive resin layer, and the temporary support which have been described in the present disclosure, and the preferable aspects thereof are the same as described above.

Further, the laminate according to the present disclosure may further include the above-described functional layer or the thermoplastic resin layer as an optional layer. The laminate according to the embodiment of the present disclosure which includes these layers can be produced by using a transfer film including these layers in the step of laminating the transfer film described above. The layer configuration (the position of a layer) and each component contained in the layer are the same as the layer configuration and each component contained in the layer described in the section of the transfer film.

A base material having patterns of etching layers which are different from each other on two surfaces can be prepared by performing the step of performing exposure, the step of forming the resist pattern, the step of removing the etching layer, and the step of peeling the resist pattern which are the steps described above in this order using the laminate according to the embodiment of the present disclosure.

EXAMPLES

Hereinafter, the present invention will be described in more detail based on examples, but the present invention is not limited to the following examples unless the scope of the present invention is not impaired.

Hereinafter, "parts" and "%" are on a mass basis unless otherwise specified.

(Preparation of Base Material Having Etching Layers On Two Surfaces)
<Preparation of Base Material 1 (Base Material Having Ag Nanowire-Containing Layer)>
[Preparation of Silver Nanowire Dispersion Liquid]

60 parts by mass of ethylene glycol and 2.5 parts by mass of polyvinylpyrrolidone (PVP) were put into a container at room temperature (25° C.), and the mixture was heated to 135° C. for 10 minutes while being stirred at 500 rpm (rotation per minute). Thereafter, the mixture was continuously stirred in a state in which the temperature thereof was maintained at 135° C. Further, after 10 minutes from the time point at which the temperature reached 135° C., a sodium chloride solution obtained by dissolving 0.006 parts by mass (0.1 parts by mmol) of sodium chloride in 0.6 parts by mass of ethylene glycol in a separate container in advance was added thereto. After 3 minutes from the time point at which the sodium chloride solution was added, a silver nitrate solution obtained by dissolving 0.85 parts by mass (5.0 parts by mmol) of silver nitrate in 7.65 parts by mass of ethylene glycol in a separate container in advance was added thereto. After the addition of the silver nitrate solution, the stirring rate was changed to 100 rpm, the solution was held at 135° C. for 3.0 hours, the heating was completed, and the resulting solution was naturally cooled to room temperature (25° C.).

After the solution temperature in the container reached room temperature (25° C.), the slurry after the reaction was taken out to a centrifuge tube, distilled water was added to perform cleaning, and centrifugation was performed at 3000 rpm for 5 minutes. The supernatant after the centrifugation was removed, methanol was added to the remaining precipitate to obtain a slurry, and centrifugation was performed at 2500 rpm for 5 minutes. The supernatant after the centrifugation was removed, methanol was added to the remaining precipitate again to obtain a slurry, and centrifugation was performed at 1500 rpm for 10 minutes. The supernatant after the centrifugation was removed, water was added to the remaining precipitate, and the solution was stirred at 500 rpm for 10 minutes, thereby obtaining a silver nanowire dispersion liquid.

The average long axis length and the average short axis length of the obtained silver nanowires were measured using the following method, the average long axis length was 10 μm the average short axis length (average diameter) was 70 nm, and the average aspect ratio was 140.

Measurement of Average Long Axis Length and Average Short Axis Length of Metal Nanowires 300 metal nanowires were randomly selected from metal nanowires observed through magnified observation using a transmission electron microscope (TEM; manufactured by JEOL, Ltd., JEM-2000FX), the long axis length and the short axis length (diameter) of the selected metal nanowires were measured, and the respective arithmetic average values were set as the average long axis length and the average short axis length (average diameter) of the metal nanowires.

[Preparation of Base Material 1]

One surface of a polyethylene terephthalate base material (film thickness of 40 μm) was coated with the obtained silver nanowire dispersion liquid, and the solution was dried at 80° C. for 2 minutes to form a transparent conductive layer containing silver nanowires on the base material and having a thickness of 200 nm.

Similarly, a transparent conductive layer containing silver nanowires and having a thickness of 200 nm was formed on the other surface so that a transparent base material having layers (etching layers) containing silver nanowires on two surfaces thereof was prepared.

Here, it was confirmed that the transmittance of the polyethylene terephthalate base material at a wavelength of 360 nm to 410 nm was 80% or greater. Further, it was confirmed that the transmittance of the base material and the transmittance of the transparent conductive layer having a thickness of 200 nm which was formed in the above-described manner at a wavelength of 360 nm to 410 nm were respectively 80% or greater.

<Preparation of Base Material 2 (Base Material Having Indium Tin Oxide (ITO) Layer)>

A cycloolefin resin film (base material) having a film thickness of 38 pm and a refractive index of 1.53 was subjected to surface modification by performing a corona discharge treatment at an output voltage of 100% and an output of 250 W for 3 seconds using a high frequency oscillator under conditions of an electrode length of 240 mm at an interval of 1.5 mm between work electrodes using a wire electrode having a diameter of 1.2 mm.

Next, two surfaces of the surface-modified cycloolefin resin film substrate were coated with the material listed in Table 1 using a slit-like nozzle, irradiated with ultraviolet rays (integrated light quantity of 300 mJ/cm$^2$), and dried at approximately 110° C., thereby forming a transparent film having a refractive index of 1.60 and a film thickness of 80 nm. It was confirmed that the transmittances of the base material and the transparent film at a wavelength of 365 nm and a wavelength of 405 nm as the exposure wavelengths in the examples described below were respectively 80% or greater.

TABLE 1

| Material | Parts by mass |
|---|---|
| Zirconium oxide particles (manufactured by Solar Co., Ltd., ZR-010) | 2.08 |
| Polymerizable compound 1 (manufactured by Nippon Kayaku Co., Ltd., KAYARAD DPHA) | 0.29 |
| Polymerizable compound 2 (manufactured by Shin-Nakamura Chemical Co., Ltd., NK OLIGO UA-32P) | 0.14 |
| Polymerizable compound 3 (manufactured by Osaka Organic Chemical Industry Ltd., VISCOAT#802) | 0.36 |
| Resin 45 mass % solution of polymer P-25(Mw of 35000, the following structure) (Solvent: 1-methoxy-2-propyl acetate) | 1.89 |
| Surfactant Polymer represented by Formula (3) | 0.003 |
| Polymerization initiator 1 (manufactured by BASF SE, Irgacure379) | 0.03 |
| Polymerization initiator 2 (manufactured by Nippon Kayaku Co., Ltd., Kayacure DETX-S) | 0.03 |
| 1-Methoxy-2-propyl acetate | 39 |
| Methyl ethyl ketone | 57 |

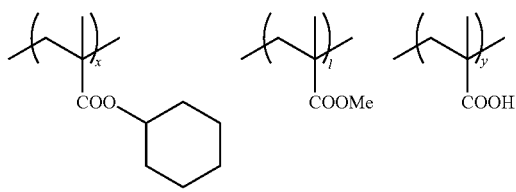
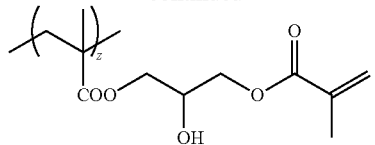

P-25 x:l:y:z = 46:2:20:32

In the structural formula representing the polymer P-25, x, l, y, and z indicate the molar ratio. Further, Me represents a methyl group.

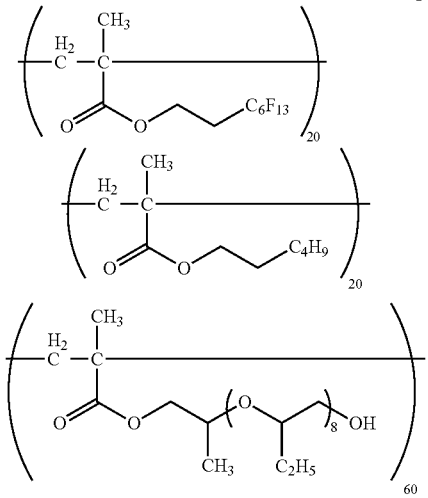

Formula (3)

In the structural formula representing the polymer P-25, the subscript of each constitutional unit represents the molar ratio.

The obtained cycloolefin resin film having a transparent film was introduced into a vacuum chamber, and an ITO thin film having a thickness of 40 nm and a refractive index of 1.82 was formed on two surfaces of a substrate by DC magnetron sputtering using an ITO target having a SnO2 content of 10% by mass (indium:tin=95:5 (molar ratio)). Therefore, a film in which the transparent film and the transparent conductive layer (etching layer) were formed on two surfaces of the transparent film substrate was obtained. The DC magnetron sputtering was carried out under conditions of a transparent film substrate temperature of 150° C., an argon pressure of 0.13 Pa, and an oxygen pressure of 0.01 Pa. The surface electrical resistance of the ITO thin film was 80 ω/□ (ω per square).

Here, it was confirmed that the transmittance of the cycloolefin resin film having a transparent film at a wavelength of 360 nm to 410 nm was 80% or greater. Further, it was confirmed that the transmittance of the formed transparent conductive layer having a thickness of 40 nm at a wavelength of 360 nm to 410 nm was 80% or greater.

(Preparation of Transfer Film)

In each example and each comparative example, a temporary support (a polyethylene terephthalate film having a thickness of 16 μm and a haze of 0.12%) was coated with the material listed in Table 3 using a slit-like nozzle and dried in a convection oven at 100° C. for 2 minutes to form a layer with the thickness listed in Table 2, and a cover film (a polypropylene film having a thickness of 12 μm and a haze of 0.2%) was bonded thereto, thereby preparing a transfer film. The compositions of the materials A-1 to A-14 listed in Table 2 are listed in Table 3. The numerical values in Table 3 indicate the content of each component (the mass of the solid content).

In Table 2, the "O. D" of the "photosensitive resin layer" indicates the optical density of the photosensitive resin layer in the transfer film, the description in the columns of the "material" indicates the material used for formation of the photosensitive resin layer in the transfer film, and the description in the columns of the "film thickness (μm)" indicates the film thickness (μm) of the photosensitive resin layer in the transfer film. Further, the optical density of the photosensitive resin layer was measured by setting the measurement mode of V-7000 to Abs.

(Pattern Formation)

In each example and each comparative example, it was confirmed that the patterns were able to be formed using the prepared transfer film.

In each example and each comparative example, the prepared transfer film was cut into a size of 50 cm$^2$, the cover film was peeled off, and the transfer film was laminated on two surfaces of the prepared base material 1 or base material 2 under the lamination conditions of a roll temperature of 90° C., a linear pressure of 0.8 MPa, and a linear speed of 3.0 m/min.

In Table 2, the example in which "1" is described in the columns of "used base material" is an example of using the base material 1, and the example in which "2" is described in the columns thereof is an example of using the base material 2.

The optical density and the film thickness of the formed photosensitive resin layer are the same as the optical density and the film thickness of the photosensitive resin layer in the transfer film described in Table 2.

A laminate formed by the above-described lamination in the example of the present disclosure is the laminate according to the embodiment of the present disclosure.

Thereafter, a glass mask (duty ratio of 1:1) having a line and space pattern with a line width of 15 μm was adhered to the film without peeling the temporary support off, and two surfaces of the photosensitive resin layer were simultaneously exposed. During the exposure of two surfaces thereof, the mask was disposed such that the line patterns were orthogonal to each other on the front and rear surfaces. The exposure amount was set as the value listed in Table 2. As the values of the exposure amounts in Table 2, the exposure amounts at a wavelength of 365 nm are listed in the columns of Examples 1 to 20 and the exposure amounts at a wavelength of 405 nm are listed in the column of Example 21.

In Examples 1 to 20, an ultrahigh-pressure mercury lamp including light having a wavelength of 365 nm was used as the exposure light source.

In Example 21, an ultrahigh-pressure mercury lamp including light having a wavelength of 365 nm was used as the exposure light source, but mask exposure was performed through a band-pass filter for mercury exposure (center wavelength of 405 nm, manufactured by Asahi Spectra Co., Ltd.).

The base material was allowed to stand for 1 hour after the exposure, the temporary support was peeled off, and two surfaces were developed to form a resist pattern having line patterns orthogonal to each other on the front and rear surfaces thereof. The development was performed by carrying out shower development for 30 seconds using a 1.0% sodium carbonate aqueous solution (developer) at 28° C. Further, two surfaces of the base material were developed at once by supplying a developer simultaneously to two surfaces thereof.

Next, the etching layer of the base material having the resist pattern was etched using an acidic etching solution containing 1% HNO$_3$, 1% NaNO$_3$, and 5 ppm of KMnO$_4$. Two surfaces of the base material were etched at once by supplying the acidic etching solution simultaneously to two surfaces thereof. Two surfaces were etched at 35° C. for 45 seconds, rinsed with water, and dried under N$_2$ flow.

Further, the resist pattern was removed using a peeling solution ("N-322", manufactured by Nagase ChemteX Corporation).

It was confirmed that the line and space patterns of the etching layers without defects were formed on two surfaces and the directions of the line and space patterns were orthogonal to each other on the front and rear surfaces thereof by observing the patterns on the front and rear surfaces thereof after the above-described steps were performed.

<Evaluation of Amount of Undercuts>

In each example or each comparative example, the base material 1 or the base material 2 listed in Table 2 was prepared.

Next, the transfer film in each example or each comparative example was cut into a size of 50 cm$^2$, the cover film was peeled off, and the transfer film was laminated on two surfaces of the base material under the lamination conditions of a roll temperature of 90° C., a linear pressure of 0.8 MPa, and a linear speed of 3.0 m/min.

Thereafter, the photosensitive resin layer was exposed through a line and space pattern mask (duty ratio of 1:1) with a line width of 20 μm without peeling the temporary support off. The exposure amount was set as listed in Table 2.

In Examples 1 to 20, an ultrahigh-pressure mercury lamp including light having a wavelength of 365 nm was used as the exposure light source.

In Example 21, an ultrahigh-pressure mercury lamp including light having a wavelength of 365 nm was used as the exposure light source, but mask exposure was performed through a band-pass filter for mercury exposure (center wavelength of 405 nm, manufactured by Asahi Spectra Co., Ltd.).

After the exposure, the base material was allowed to stand for 1 hour, the temporary support was peeled off, and two surfaces were developed to obtain a resist pattern. The development was performed by carrying out shower development for 30 seconds using a 1.0% sodium carbonate aqueous solution (developer) at 28° C. Further, two surfaces of the base material were developed at once by supplying a developer simultaneously to two surfaces thereof.

The shape of the cross section of the 20 μm line pattern (resist pattern) in the vertical direction was observed using a scanning electron microscope. The dimensional difference between the top (outermost layer side) and the bottom (etching layer side) in the cross section of the resist pattern was defined as the amount of undercuts, and the evaluation was performed based on the following evaluation standards. The evaluation results are listed in Table 2. As the amount of undercuts decreases, the pattern shape of the resist pattern to be obtained becomes excellent.

A: The amount of undercuts was less than 1.0 μm.

B: The amount of undercuts was 1.0 μm or greater and less than 2.0 μm.

C: The amount of undercuts was 2.0 μm or greater and less than 3.0 μm.

D: The amount of undercuts was 3.0 μm or greater.

<Evaluation of Exposure Fogging>

Next, the transfer film prepared in each example or each comparative example was cut into a size of 50 cm$^2$, the cover film was peeled off, and the transfer film was laminated on two surfaces of the base material listed in Table 2 under the conditions of a roll temperature of 90° C., a linear pressure of 0.8 MPa, and a linear speed of 3.0 m/min.

In Examples 1 to 20, one surface of the photosensitive resin layer was exposed (the exposure amount was set as listed in Table 2), using an ultrahigh-pressure mercury lamp, through a line and space pattern mask (duty ratio of 1:1) with a line width of 20 μm without peeling the temporary support off, the base material was allowed to stand for 1 hour, the temporary support was peeled off, and two surfaces thereof were developed.

In Example 21, the same treatment was performed as described above except that one surface was exposed (exposure amount of 100 mJ/cm$^2$, measured at a wavelength of 405 nm) through a band-pass filter for mercury exposure (center wavelength of 405 nm, manufactured by Asahi Spectra Co., Ltd.).

The development was performed by carrying out shower development for 30 seconds using a 1.0% sodium carbonate aqueous solution (developer) at 28° C. Further, two surfaces of the base material were developed at once by supplying a developer simultaneously to two surfaces thereof.

The side where the base material was not exposed was observed, and the exposure fogging was evaluated as follows.

In a case where residues were found on the side where the base material was not exposed, this indicates that exposure light applied to one surface also exposed the other surface, in other words, exposure fogging occurred.

A: Residues were not found even in a case of observation using an optical microscope at a magnification of 50 times or observation with the naked eyes.

B: Trace amounts of residues were found in a case of observation using an optical microscope at a magnification of 50 times, but residues were not found in a case of observation with the naked eyes.

C: Residues were found in both cases of observation using an optical microscope at a magnification of 50 times and observation with the naked eyes.

TABLE 2

| | | Example | | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 | 13 |
| Base material used | | 1 | 1 | 1 | 1 | 1 | 1 | 1 | 1 | 2 | 2 | 2 | 2 | 2 |
| Photosensitive resin layer | O.D. | 0.5 | 1.0 | 1.1 | 1.5 | 1.6 | 2.3 | 2.5 | 2.0 | 0.5 | 1.0 | 1.1 | 1.5 | 1.6 |
| | Material | A-3 | A-4 | A-5 | A-6 | A-7 | A-8 | A-9 | A-12 | A-3 | A-4 | A-5 | A-6 | A-7 |
| | Film thickness (μm) | 3.0 | 2.0 | 3.0 | 8.0 | 9.0 | 3.0 | 3.0 | 3.0 | 3.0 | 2.0 | 3.0 | 8.0 | 9.0 |
| Exposure amount (mJ/cm$^2$) | | 100 | 100 | 100 | 100 | 100 | 100 | 100 | 100 | 100 | 100 | 100 | 100 | 100 |
| Amount of undercuts | | A | A | A | A | B | B | C | A | A | A | A | A | B |
| Exposure fogging | | B | A | A | A | A | A | A | A | B | A | A | A | A |

| | | Example | | | | | | | | Comparative Example | | | |
|---|---|---|---|---|---|---|---|---|---|---|---|---|---|
| | | 14 | 15 | 16 | 17 | 18 | 19 | 20 | 21 | 1 | 2 | 3 | 4 |
| Base material used | | 2 | 2 | 2 | 2 | 2 | 2 | 2 | 2 | 1 | 1 | 1 | 1 |
| Photosensitive resin layer | O.D. | 2.3 | 2.5 | 2.0 | 1.5 | 1.5 | 1.5 | 1.5 | 1.5 | 0.2 | 0.4 | 2.7 | 3.0 |
| | Material | A-8 | A-9 | A-12 | A-6 | A-6 | A-6 | A-13 | A-14 | A-1 | A-2 | A-10 | A-11 |
| | Film thickness (μm) | 3.0 | 3.0 | 3.0 | 8.0 | 8.0 | 8.0 | 8.0 | 8.0 | 3.0 | 3.0 | 3.0 | 3.0 |
| Exposure amount (mJ/cm$^2$) | | 100 | 100 | 100 | 80 | 150 | 200 | 100 | 100 | 100 | 100 | 100 | 100 |
| Amount of undercuts | | B | C | A | A | A | A | A | A | A | A | D | D |
| Exposure fogging | | A | A | A | A | A | A | A | A | C | C | A | A |

TABLE 3

| | Material | A-1 | A-2 | A-3 | A-4 | A-5 | A-6 | A-7 | A-8 | A-9 | A-10 | A-11 | A-12 | A-13 | A-14 |
|---|---|---|---|---|---|---|---|---|---|---|---|---|---|---|---|
| Photopolymerizable compound | Tricyclodecane dimethanol diacrylate (A-DCP, manufactured by Shin-Nakamura Chemical Co., Ltd.) | — | 10.8 | — | — | — | — | — | — | — | — | — | — | — | — |
| | Carboxylic acid-containing monomer ARONIX TO-2349 (manufactured by Toagosei Co., Ltd.) | 20.2 | — | — | — | — | — | 3.0 | 25.5 | — | — | 10.3 | — | — | — |
| | Acrylic monomer ARONIX M-310 (manufactured by Toagosei Co., Ltd.) | — | 36.3 | — | 47.0 | — | — | — | 15.3 | — | 25.1 | — | 47.0 | — | — |
| | Ditrimethylolpropane tetraacetate ARONIX M-310 (AD-TMP, manufactured by Shin-Nakamura Chemical Co., Ltd.) | 26.3 | 10.5 | 26.2 | — | 56.4 | — | — | — | 20.0 | — | 10.3 | — | — | — |
| | Bisphenol A-modified dimethacrylate NK ester BPE-500(manufactured by Shin-Nakamura Chemical Co., Ltd.) | 10.0 | — | — | 10.8 | — | 30.1 | 15.0 | 15.0 | 45.1 | 10.0 | 20.1 | 10.8 | 30.1 | 30.1 |
| | Karenz MOI-BM (manufactured by Showa Denko K. K.) | — | — | 18.3 | — | — | — | 20.2 | 3.0 | — | 8.2 | 5.2 | — | — | — |
| | Urethane acrylate 8UX-015A (manufactured by Taisei Chemical Co., Ltd.) | — | — | 12.5 | — | — | 26.3 | — | — | — | 20.1 | — | — | 26.3 | 26.3 |
| Binder polymer | Compound A(Acid value of 95 mgKOH/g, Mw of 27000) | 202.6 | 202.6 | — | — | — | — | — | — | — | — | — | — | — | — |
| | Binary copolymer containing 80% by mass of benzyl methacrylate and 20% by mass of methacrylic acid (weight-average molecular weight of 30000) | — | — | 200.0 | 200.0 | 202.6 | 202.6 | 202.6 | 202.6 | 202.6 | 202.6 | 202.6 | 200.0 | 202.6 | 202.6 |
| Photopolymerization initiator | Ethanol, 1-[9-ethyl-6-(2-methylbenzoyl)-9H-carbazole-3-yl]-1-(O-acetyloxime) (OXE-02, manufactured by BASF SE) | — | — | — | — | — | — | — | — | 1.7 | — | — | — | — | — |
| | 2-Benzyl-2-dimethylamino-1-(4-morpholinophenyl)butanone (IRGACURE 379, manufactured by BASF SE) | — | — | 1.2 | — | — | — | — | — | — | — | — | — | — | — |
| | BCIM(trade name, 2,2′-bis(o-chlorophenyl)-4,5,4′,5′-tetraphenyl-1,2′-biimidazole, (manufactured by Hampford Research Inc.) | — | — | — | — | — | — | — | — | — | — | — | — | — | 3.0 |
| | 1,2-octanedione, 1[4-(phenylthio)-, 2-(O-benzoyloxime) | 3.2 | 3.2 | 2.0 | 3.2 | 3.2 | 3.2 | 3.2 | 3.2 | 1.6 | 3.2 | 3.2 | 3.2 | 3.2 | — |
| Ultraviolet absorbing material | TINUVIN329 (manufactured by BASF SE) | — | — | — | — | — | — | — | 3.5 | — | — | — | — | — | — |
| | TINUVIN391 (manufactured by BASF SE) | — | — | — | — | — | — | — | — | — | — | — | — | 0.6 | — |
| | KEMISORB11S (manufactured by Chemipro Kasei Kaisha, Ltd.) | — | — | — | — | — | — | — | — | — | — | 4.5 | — | — | — |
| | Carbon black dispersion liquid FDK-017 (manufactured by Tokyo Printing Ink MFG Co., Ltd.) concentration of solid contents: 38% | — | 6.9 | 10.4 | 41.5 | 31.1 | 11.2 | 16.1 | 41.5 | 79.5 | 86.4 | 79.5 | 62.2 | — | 11.2 |
| Additive | Benzimidazole (manufactured by Tokyo Chemical Industry Co., Ltd.) | 0.20 | — | — | — | — | — | — | — | — | — | — | — | — | — |
| | 1,2,4-triazole (manufactured by Otsuka Chemical Co., Ltd.) | — | — | — | 0.20 | — | — | — | — | — | — | — | 0.20 | — | — |
| | Coumarin102 (manufactured by Acro-X Corporation) | — | — | — | — | — | — | — | — | — | — | — | — | — | 0.50 |
| | Lueco Crystal Violet (manufactured by Tokyo Chemical Industry Co., Ltd.) | — | — | 0.10 | — | — | — | — | — | — | — | — | — | — | — |
| | MEGAFACE F551A (manufactured by DIC Corporation) | 1.18 | 1.18 | 1.18 | 1.18 | 1.18 | 1.18 | 1.18 | 1.18 | 1.18 | 1.18 | 1.18 | 1.18 | 1.18 | 1.18 |
| Solvent | 1-Methoxy-2-propyl acetate | 433 | 419 | 423 | 312 | 313 | 333 | 346 | 297 | 256 | 251 | 260 | 291 | 343 | 332 |
| | Methyl ethyl ketone | 303 | 310 | 305 | 384 | 393 | 393 | 393 | 393 | 393 | 393 | 393 | 384 | 393 | 393 |
| | Total (parts by mass) | 1000 | 1000 | 1000 | 1000 | 1000 | 1000 | 1000 | 1000 | 1000 | 1000 | 1000 | 1000 | 1000 | 1000 |

In Comparative Examples 1 to 4, the base material 1 was used as the base material, but the evaluation results of the amount of undercuts and the exposure fogging were the same as described above even in a case where the base material 2 was used as the base material.

In Table 3, the "compound A" is a compound represented by the following structural formula. In the following structural formula, the subscripts of parentheses represent the content (molar ratio) of each constitutional unit.

Compound A

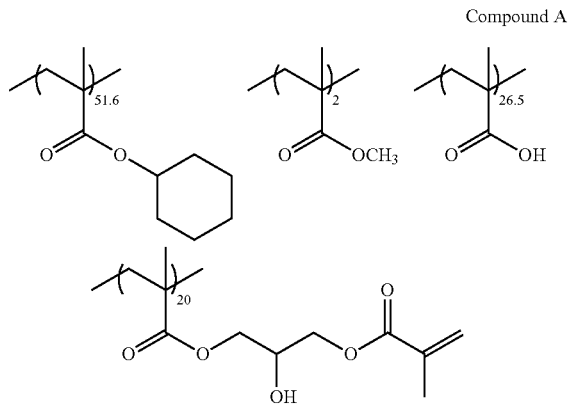

Further, in Table 3, OXE-01 and OXE-02 each represent a compound having the following structure.

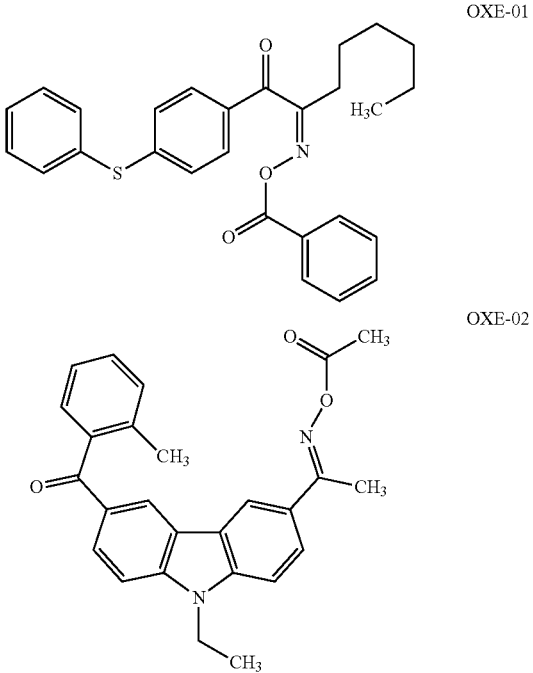

As described above, according to the pattern formation method according to the examples of the present disclosure, the pattern shape of the etching resist to be obtained was excellent and the exposure fogging on one surface caused by exposure light applied to the other surface was suppressed.

The disclosure of JP2017-147152 filed on Jul. 28, 2017 is incorporated herein by reference.

In a case where all documents, patent applications, and technical standards described in the present specification are specified to be incorporated specifically and individually as cited documents, the documents, patent applications, and technical standards are incorporated herein in the same limited scope as the cited documents.

EXPLANATION OF REFERENCES

10: transfer film
12: temporary support
14: photosensitive resin layer
16: protective film (protective release layer)
18: etching layer
20: base material

What is claimed is:

1. A pattern formation method comprising:
   a step of preparing a base material which has an etching layer transparent to an exposure wavelength on each of two surfaces thereof and is transparent to the exposure wavelength;
   a step of forming a photosensitive resin layer, in which an optical density to the exposure wavelength is in a range of 0.50 to 2.50, on the etching layer on each of the two surfaces of the base material;
   a step of pattern-exposing the photosensitive resin layer;
   a step of developing the photosensitive resin layer to form a resist pattern on each of the two surfaces;
   a step of removing the etching layer on a portion that is not coated with the resist pattern; and
   a step of peeling the resist pattern off, in this order.

2. The pattern formation method according to claim 1, wherein an exposure amount in the step of exposure is in a range of $10^{(n-0.5)}$ mJ/cm$^2$ to $10^{(n+1.5)}$ mJ/cm$^2$, and n represents the optical density of the photosensitive resin layer to the exposure wavelength.

3. The pattern formation method according to claim 2, wherein the exposure amount in the step of exposure is in a range of $10^n$ mJ/cm$^2$ to $10^{(n+1.0)}$ mJ/cm$^2$.

4. The pattern formation method according to claim 1, wherein a film thickness of the photosensitive resin layer is 8.0 μm or less.

5. The pattern formation method according to claim 1, wherein exposure light in the step of exposure has a maximum wavelength at a wavelength of 365 nm.

6. The pattern formation method according to claim 1, wherein the step of forming the photosensitive resin layer is a step of laminating a transfer film, which includes a temporary support and a photosensitive resin layer with an optical density of 0.50 to 2.50 on the temporary support, on the etching layer.

7. The pattern formation method according to claim 6, wherein an optical density of the entire transfer film having been laminated in the step of laminating the transfer film is in a range of 0.50 to 2.50.

8. The pattern formation method according to claim 1, wherein the optical density of the formed photosensitive resin layer in the step of forming the photosensitive resin layer is in a range of 1.00 to 2.00.

9. The pattern formation method according to claim 1, wherein the photosensitive resin layers on the two surfaces of the base material are simultaneously exposed in the step of exposure.

10. The pattern formation method according to claim 1, wherein the etching layer is a conductive layer.

11. The pattern formation method according to claim 1, wherein the photosensitive resin layer contains a polymerizable compound and a polymerization initiator.

12. The pattern formation method according to claim 1, wherein the photosensitive resin layer contains an ultraviolet absorbing material.

13. The pattern formation method according to claim 12, wherein the ultraviolet absorbing material contains carbon black.

14. A method of producing a touch panel, comprising: the pattern formation method according to claim 1.

15. A laminate comprising:
a base material which is transparent to an exposure wavelength;
two etching layers which are respectively disposed on two surfaces of the base material and are transparent to the exposure wavelength; and
two photosensitive resin layers which are respectively disposed on the two etching layers and in which an optical density to the exposure wavelength is in a range of 0.50 to 2.50.

* * * * *